United States Patent
Kadotani et al.

(10) Patent No.: US 7,554,250 B2
(45) Date of Patent: Jun. 30, 2009

(54) LAMINATE-TYPE PIEZOELECTRIC ELEMENT AND METHOD OF PRODUCING THE SAME

(75) Inventors: Shige Kadotani, Chita-gun (JP); Akio Iwase, Nishio (JP); Teruaki Yamaguchi, Anjo (JP)

(73) Assignee: Denso Corporation, Kariya, Aichi-Pref (JP)

( * ) Notice: Subject to any disclaimer, the term of this patent is extended or adjusted under 35 U.S.C. 154(b) by 217 days.

(21) Appl. No.: 11/641,121

(22) Filed: Dec. 19, 2006

(65) Prior Publication Data

US 2007/0164638 A1 Jul. 19, 2007

(30) Foreign Application Priority Data

Dec. 19, 2005 (JP) ............................. 2005-365252

(51) Int. Cl.
*H01L 41/047* (2006.01)
(52) U.S. Cl. .................... 310/365; 310/364; 310/366
(58) Field of Classification Search .......... 310/363–366
See application file for complete search history.

(56) References Cited

U.S. PATENT DOCUMENTS

| | | | | |
|---|---|---|---|---|
| 4,348,904 A | * | 9/1982 | Bautista, Jr. ................. 73/644 |
| 5,440,320 A | * | 8/1995 | Lach et al. ................... 343/915 |
| 6,001,299 A | * | 12/1999 | Kawabe et al. .............. 264/436 |
| 6,203,304 B1 | * | 3/2001 | Lopez Tonazzi et al. .... 425/110 |
| 6,216,545 B1 | * | 4/2001 | Taylor ................... 73/862.046 |
| 6,522,052 B2 | * | 2/2003 | Kihara et al. ............... 310/366 |
| 6,700,306 B2 | | 3/2004 | Nakamura et al. |
| 2006/0022558 A1 | * | 2/2006 | Bindig et al. ............... 310/366 |
| 2006/0232172 A1 | * | 10/2006 | Asano et al. ............... 310/366 |

FOREIGN PATENT DOCUMENTS

| | | |
|---|---|---|
| JP | 2001-244514 | 9/2001 |
| JP | 2003-86853 | 3/2003 |

* cited by examiner

*Primary Examiner*—Jaydi SanMartin
(74) *Attorney, Agent, or Firm*—Nixon & Vanderhye PC

(57) ABSTRACT

A laminate-type piezoelectric element has a ceramic laminated body obtained by alternately laminating piezoelectric layers made of a piezoelectric material and inner electrode layers having electrical conductivity. Outer electrodes are joined to side surfaces of the ceramic laminated body via an electrically conductive adhesive. The electrically conductive adhesive has buried therein mesh bodies obtained by forming a mesh by using a nonmetallic material. The mesh bodies are desirably constituted by using any one of a resin, ceramic, carbon or glass.

13 Claims, 8 Drawing Sheets

LAMINATE-TYPE PIEZOELECTRIC ELEMENT AND METHOD OF PRODUCING THE SAME

TECHNICAL FIELD

The present invention relates to a laminate-type piezoelectric element applied to, for example, a piezoelectric actuator and the like and to a method of producing the same.

BACKGROUND ART

In recent years, injectors for fuel injection for automobiles using laminate-type piezoelectric elements have been developed from the standpoint of improving fuel efficiency of automobiles and from the environmental point of view, such as reduced exhaust gas emission.

The laminate-type piezoelectric element has a ceramic laminated body obtained by alternately laminating piezoelectric layers usually made of a piezoelectric material and inner electrode layers having electrical conductivity, and has outer electrodes joined to the side surfaces of the ceramic laminated body via an electrically conductive adhesive. When a voltage is applied across the inner electrode layers, the piezoelectric layers undergo a displacement so as to be driven.

When the laminate-type piezoelectric element is used, for example, for an injector, a variety of problems arise in severe environments, such as being used for extended periods of time in a high-temperature atmosphere. For example, when the element is driven, i.e., when the ceramic laminated body is contracted and elongated in a direction of lamination due to piezoelectric displacement, stress is exerted on the electrically conductive adhesive arranged on the side surface thereof. When the stress is repetitively exerted, a problem arises in that cracks develop in the electrically conductive adhesive. Therefore, electric conduction (hereinafter simply referred to as conduction) is not maintained between the inner electrode layers and the outer electrodes which are electrically conductive to each other via the electrically conductive adhesive, and problems such as poor conduction may arise.

In order to solve the above problem, for example, Japanese Unexamined Patent Publication No. 2003-086853 discloses the structure of a laminated-type piezoelectric, element in which metallic plate-like conducting members are joined to the side surfaces of the pole-like laminated body (ceramic laminated body), and an electrically conductive adhesive is filled between them. Further, Japanese Unexamined Patent Publication No. 2001-244514 discloses the structure of a laminate-type piezoelectric actuator in which a thin metal plate or a metal mesh is buried in the electrically conductive adhesive provided on the side surfaces of the actuator body (ceramic laminated body). According to this document, stress generated in the electrically conductive adhesive can be relaxed while the piezoelectric element is being driven.

As the electrically conductive adhesive, however, there is usually used one containing an electrically conductive filler in a resin material which is a chief component. Therefore, characteristics (e.g., specific gravity, thermal expansion, etc.) differ greatly between an electrically conductive adhesive using resin material as a chief component and the thin metal plate, the metal mesh or the above plate-like electrically conducting member which comprises a metal material. Therefore, when the piezoelectric element is driven, stress occurs between any of these two elements which are in contact, and cracks occur in the electrically conductive adhesive.

That is, in the conventional structure, the effect of relaxing the stress that occurs in the electrically conductive adhesive when the piezoelectric element was being driven, and of suppressing the occurrence of cracks was not sufficient.

SUMMARY

The present invention was accomplished in view of the above problems inherent in the prior art, and provides a laminate-type piezoelectric element featuring excellent durability and reliability and a method of producing the same.

A first aspect of the invention relates to a laminate-type piezoelectric element having a ceramic laminated body obtained by alternately laminating piezoelectric layers made of a piezoelectric material and inner electrode layers having electrical conductivity, and having outer electrodes joined to the side surfaces of the ceramic laminated body via an electrically conductive adhesive, wherein the electrically conductive adhesive has buried therein at least parts of mesh bodies obtained by forming a mesh by using a nonmetallic material.

In the laminate-type piezoelectric element of this embodiment, at least parts of the mesh bodies obtained by forming a nonmetallic material in the form of a mesh are buried in the electrically conductive adhesive. Therefore, when the element is driven, i.e., when the ceramic laminated body is expanded and contracted in the direction of lamination due to the piezoelectric displacement, the stress produced in the electrically conductive adhesive provided on the side surfaces of the ceramic laminated body can be dispersed and relaxed by the mesh bodies of a mesh form buried in the electrically conductive adhesive.

The above mesh bodies are constituted by using a nonmetallic material. The electrically conductive adhesive in which the mesh bodies are buried is usually one containing electrically conductive filler in a resin material which is a main component. Therefore, as compared to when the mesh bodies are constituted by using a metallic material, the mesh bodies obtained by using the nonmetallic material favorably follow the electrically conductive adhesive when driven and can effectively relax stress.

As a result, even when the element is driven repetitively, stress can be relaxed to a sufficient degree, thereby suppressing the occurrence of cracks in the electrically conductive adhesive caused by stress. Also, conduction can be maintained for extended periods of time between the inner electrode layers and the outer electrodes that are electrically conducting via the electrically conductive adhesive, reducing the occurrence of problems such as poor conduction. Therefore, even after being used for extended periods of time, the laminate-type piezoelectric element exhibits excellent durability and reliability.

As described above, the present exemplary embodiment provides a laminate-type piezoelectric element featuring excellent durability and reliability.

A second aspect of the invention relates to a method of producing a laminate-type piezoelectric element having a ceramic laminated body obtained by alternately laminating piezoelectric layers made of a piezoelectric material and inner electrode layers having electrical conductivity, and having outer electrodes joined to the side surfaces of the ceramic laminated body via an electrically conductive adhesive, the method comprising:

a laminated body-forming step of forming the ceramic laminated body by alternately laminating the piezoelectric layers and the inner electrode layers;

an adhesive-applying step of applying the electrically conductive adhesive onto the side surfaces of the ceramic laminated body;

a mesh body-arranging step of burying at least parts of mesh bodies obtained by forming a mesh by using a nonmetallic material in the electrically conductive adhesive; and an external electrode-joining step of joining the external electrodes to the electrically conductive adhesive.

In the mesh-body-arranging step in the method of producing a laminate-type piezoelectric element of the invention, at least parts of the mesh bodies obtained by forming a mesh by using a nonmetallic material are buried in the electrically conductive adhesive applied to the side surfaces of the ceramic laminated body. Thus, the electrically conductive adhesive having the mesh bodies buried therein can be provided on the side surfaces of the ceramic laminated body. When the thus constituted laminate-type piezoelectric element is driven, stress produced in the electrically conductive adhesive provided on the side surfaces of the ceramic laminated body can be dispersed and relaxed by the mesh bodies of a mesh form buried in the electrically conductive adhesive.

The above mesh bodies are constituted by using a nonmetallic material and favorably follow the electrically conductive adhesive when driven as compared to when the mesh bodies are constituted by using a metallic material, and therefore can effectively relax stress.

Therefore, even when the element is driven repetitively, stress can be relaxed to a sufficient degree, thereby suppressing the occurrence of cracks in the electrically conductive adhesive caused by the stress. Also, conduction can be maintained for extended periods of time between the inner electrode layers and the outer electrodes that are electrically continuous via the electrically conductive adhesive, reducing the occurrence of problems such as poor conduction. Therefore, even after being used for extended periods of time, the laminate-type piezoelectric element obtained by the above production method exhibits excellent durability and reliability.

As described above, this production method provides a laminate-type piezoelectric element featuring excellent durability and reliability.

BRIEF DESCRIPTION OF THE DRAWINGS

FIG. 4 is a view showing sheet pieces according to Example 1.

DETAILED DESCRIPTION OF EXEMPLARY EMBODIMENTS

Figure 1:
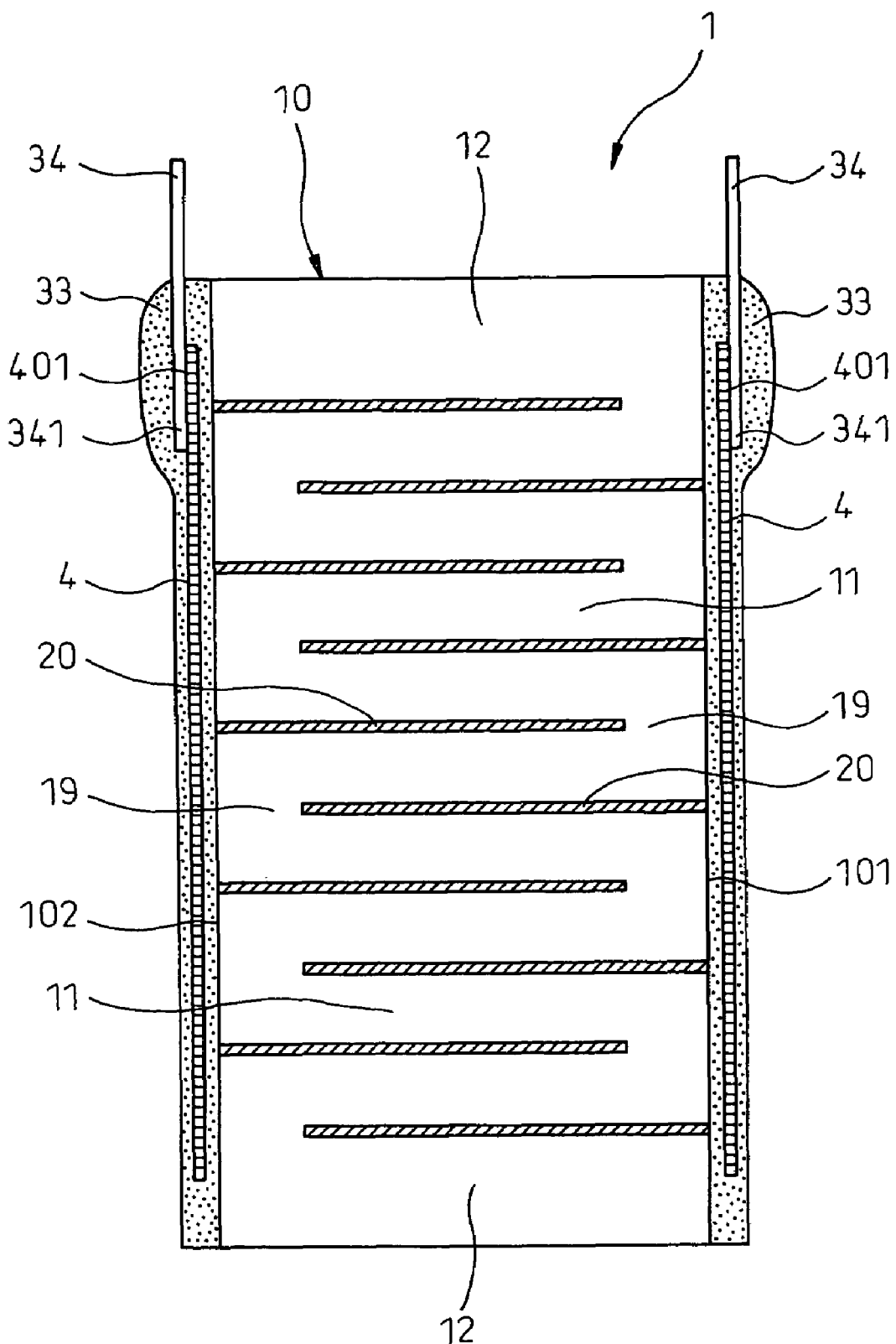
FIG. 1 is a view illustrating the structure of a laminate-type piezoelectric element according to Example 1.

In the above first and second aspects, the electrically conductive adhesive is one obtained by dispersing an electrically conductive filler in a resin material which is a chief component. As the resin material, there can be used various resins such as epoxy, silicone, urethane and polyimide. As the electrically conductive filler, there can be used a metal filler such as Ag, Pt, Cu and Ni.

It is preferable that the mesh bodies as a whole be buried in the electrically conductive adhesive.

In this case, the mesh bodies exhibit the effect of relaxing stress to a sufficient degree and also suppress the occurrence of cracks in the electrically conductive adhesive. This improves the durability and reliability of the laminate-type piezoelectric element.

The mesh of the mesh bodies can be formed by knitting or winding a plurality of wire (i.e., elongated) members made of a nonmetallic material in a predetermined direction. The diameter of the wire members in this case is preferably 150 to 400 μm and the pitch of the mesh in a range of 300 to 1000 μm.

The mesh bodies may be formed like a mesh by using a plurality of wire members or may be integrally formed as one body.

When the diameter of the wire member is smaller than 150 μm, the strength of the mesh bodies may decrease. Therefore, when the piezoelectric element is being driven, cracks may occur in the mesh bodies. When the diameter thereof exceeds 400 μm, on the other hand, the mesh bodies exhibit decreased flexibility and may not exhibit the effect of relaxing stress to a sufficient degree.

Further, when the pitch of the mesh is smaller than 300 μm, the electrically conductive adhesive may not enter into the mesh of the mesh bodies to a sufficient degree. Therefore, stress occurring in the electrically conductive adhesive may not be relaxed by the mesh bodies to a sufficient degree. When the pitch thereof exceeds 1000 μm, on the other hand, the contacting portions decrease between the mesh bodies and the electrically conductive adhesive. Therefore, the mesh bodies may fail to follow the electrically conductive adhesive when being driven. This may result in the occurrence of cracks in the electrically conductive adhesive.

It is preferable that the mesh bodies be constituted by using any one of a resin, ceramic, carbon or glass.

In this case, the mesh bodies follow the electrically conductive adhesive sufficiently while the piezoelectric element is being driven.

As the material for constituting the mesh bodies, there can be used a resin such as polyphenylene sulfide, polyimide, polyester or meta type aramide, ceramics such as alumina, silicon carbide or silicon nitride, or a glass such as alkali-free glass. In addition, carbon may be used.

The mesh body is preferably constituted by knitting a fiber of a nonmetallic material.

In this case, the mesh bodies are constituted by using a fiber so as to reduce the weight of the mesh bodies. This enables the mesh bodies to effectively follow the electrically conductive adhesive when being driven.

As the fiber constituting the mesh body, there can be used a resin fiber, a ceramic fiber, a carbon fiber or a glass fiber.

The fiber constituting the mesh bodies is preferably a fiber aggregate obtained by bundling fine fibers.

This enables the mesh bodies to effectively follow the electrically conductive adhesive while the piezoelectric element is being driven.

Further, the diameter of single yarns of the fiber constituting the mesh bodies is preferably in a range of 3 to 20 μm.

When the diameter of the single yarns is smaller than 3 μm, it becomes difficult to produce a fiber of single yarns of a desired diameter. When the diameter thereof exceeds 20 μm, on the other hand, the fiber aggregate exhibits decreased flexibility and may not exhibit the effect of relaxing stress by the mesh bodies to a sufficient degree.

In addition, the surfaces of the mesh bodies are preferably covered with an electrically conductive material.

In this case, the mesh bodies have electrical conductivity. Therefore, when the outer electrodes are joined to the electrically conductive adhesive, electric conduction between the inner electrode layers and the outer electrodes can be maintained via the electrically conductive adhesive and the mesh bodies having electrical conductivity, thereby improving the electric conduction. Further, the electric conduction is more reliably maintained by directly joining the outer electrodes to the mesh bodies.

In this context, the electrically conductive material preferably contains at least one or more kinds of Pt, Pd, Ta, Au, Ag, Cu, Ni, Zn and Sn.

In this case, the electric conduction can be maintained to a sufficient degree between the inner electrode layers and the outer electrodes.

In the first aspect of the invention, the laminate-type piezoelectric element is preferably a piezoelectric actuator for an injector used as a drive source of the injector.

The injector is used under severe conditions like in a high-temperature atmosphere. Therefore, by using the above excellent laminate-type piezoelectric element as an actuator, the durability and reliably can be improved, and performance of the injector as a whole can be improved.

EXAMPLES

Example 1

A laminate-type piezoelectric element according to an Example of the invention and a method of its production will be described below with reference to FIGS. 1 to 8d.

The laminate-type piezoelectric element 1 of this Example has, as shown in FIG. 1, a ceramic laminated body 10 obtained by alternately laminating piezoelectric layers 11 made of a piezoelectric material and inner electrode layers 20 having electrical conductivity, and has outer electrodes 34 joined to the side surfaces 101 and 102 of the ceramic laminated body 10 via an electrically conductive adhesive 33.

The electrically conductive adhesive 33 has buried therein mesh bodies 4 obtained by forming a mesh by using a nonmetallic material.

This Example will now be described in detail.

Figure 2:
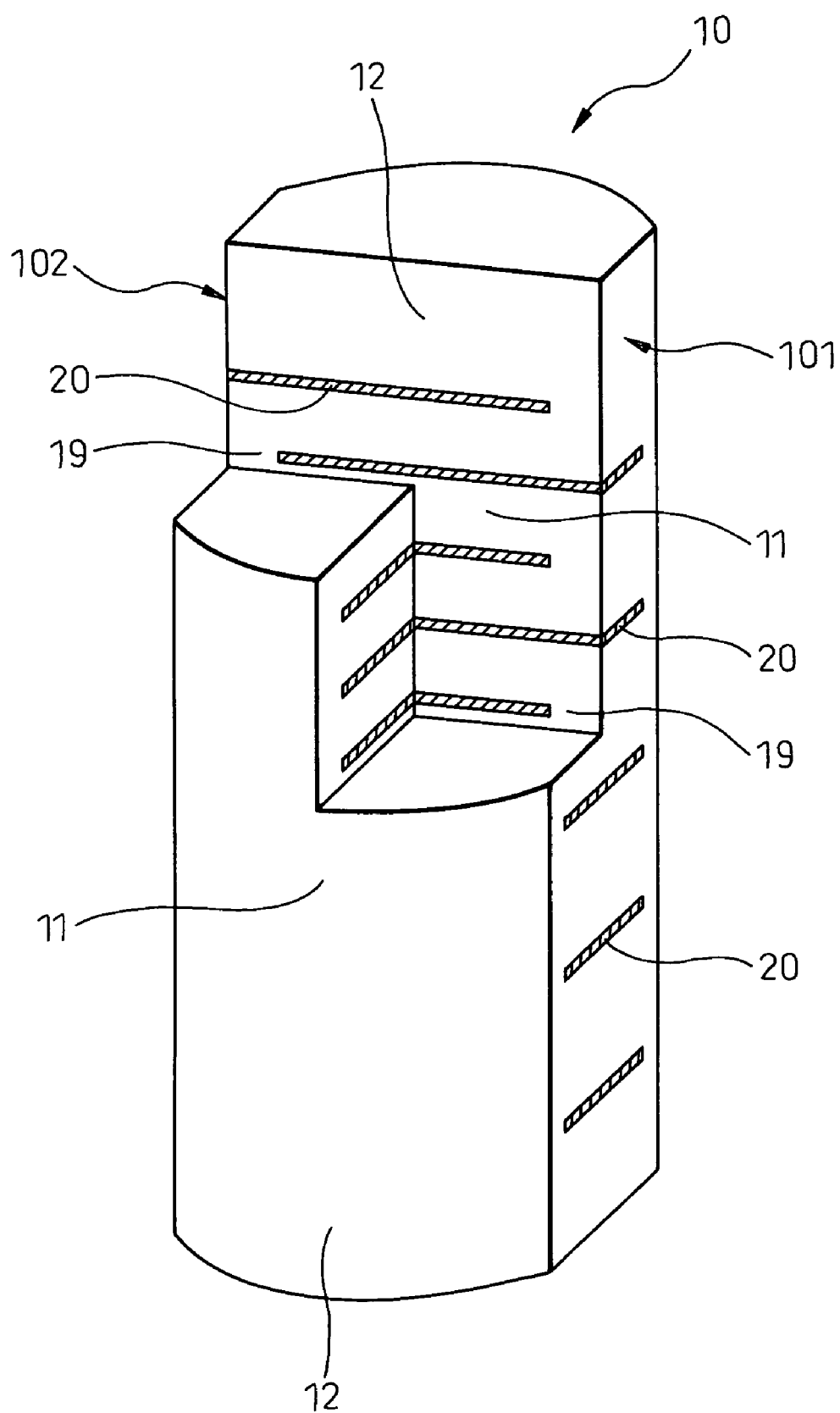
FIG. 2 is a view illustrating the entire structure of a ceramic laminated body according to Example 1.

In the laminate-type piezoelectric element 1 of this Example, the ceramic laminated body 10 has, as shown in FIG. 2, the shape of a barrel in cross section with a pair of opposing side surfaces 101 and 102 on the outer peripheral surfaces of the laminated body which is of nearly cylindrical shape. However, the sectional shape of the ceramic laminated body 10 is not limited to a barrel shape only as in this Example, but may be a circular shape, a square shape or an octagonal shape, depending upon the use.

As shown in FIGS. 1 and 2, the ceramic laminated body 10 is obtained by alternately laminating the piezoelectric layers 11 and the inner electrode layers 20. The laminated inner electrode layers 20 have ends that are alternately exposed on the pair of side surfaces 101 and 102. Further, the inner electrode layers 20 have ends that are retracted inward of the ceramic laminated body 10 at non-pole portions 19. In other words, the ceramic laminated body 10 of this Example has a so-called non-polar structure. Further, protection layers 12 which do not produce piezoelectric displacement are provided at both ends of the ceramic laminated body 10 in the direction of lamination.

The piezoelectric layers 11 are made of lead zirconate titanate (PZT) which is a piezoelectric material, and the protection layers 12 are made of the same material as the piezoelectric layers 11. The inner electrode layers 20 are made of an Ag/Pd alloy.

As the structure of the ceramic laminated body 10, there can be employed a whole surface electrode structure, as well as other various structures in addition to the partial electrode structure of this Example.

Further, as shown in FIG. 1, the electrically conductive adhesive 33 is arranged on the side surfaces 101 and 102 of the ceramic laminated body 10. The mesh bodies 4 forming a mesh by using a nonmetallic material is wholly buried in the electrically conductive adhesive 33. The mesh bodies 4 may be wholly buried in the electrically conductive adhesive 33 like in this Example, or may be partly buried therein.

Figure 8D:
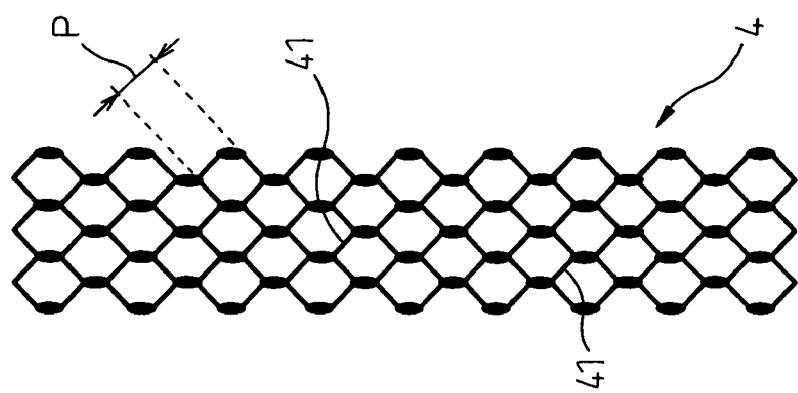
FIG. 8d is a view illustrating an example of mesh of the mesh body according to Example 1.
Figure 8C:
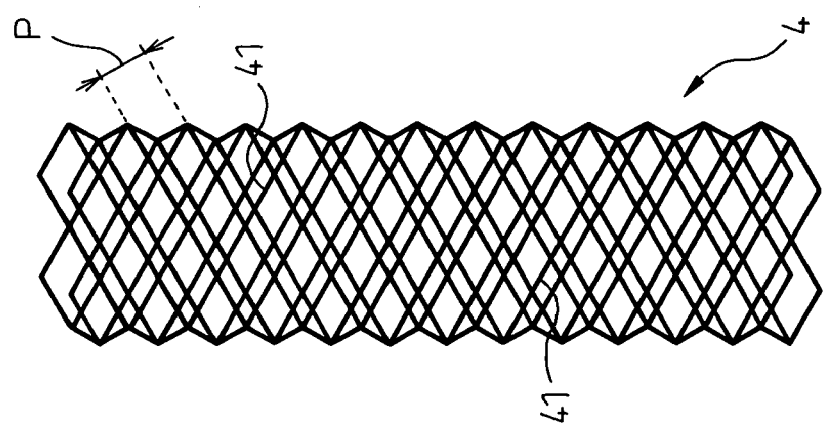
FIG. 8c is a view illustrating an example of mesh of the mesh body according to Example 1.
Figure 8B:
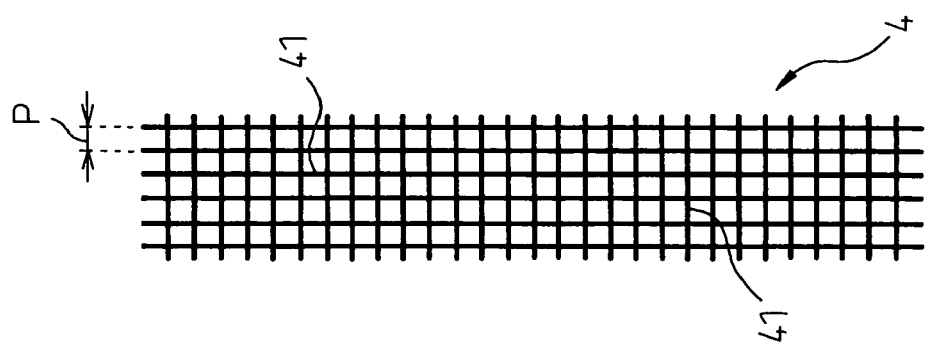
FIG. 8b is a view illustrating an example of mesh of the mesh body according to Example 1.
Figure 8A:
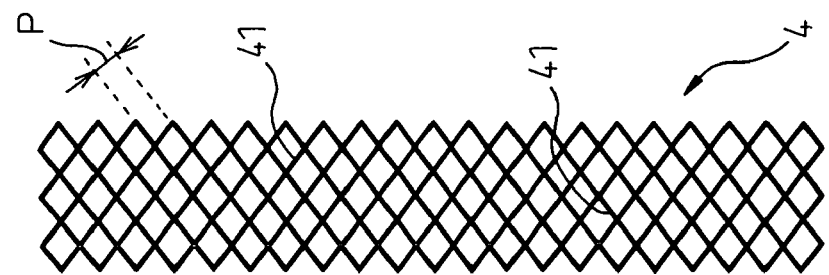
FIG. 8a is a view illustrating an example of mesh of the mesh body according to Example 1.

Referring to FIG. 8a, the mesh bodies 4 of this Example are constituted by knitting a mesh by using wire members 41 of a nonmetallic material. The mesh bodies 4 have the mesh of a rhombic shape obtained by knitting the wire members 41 aslant. The mesh has a pitch P of 400 μm.

The wire members 41 are a fiber aggregate obtained by bundling a plurality of fine single yarns of alumina fiber. The fiber aggregate is an aggregate of bundled fibers covered with a resin. The alumina fiber has a specific gravity of 3.6 g/cm$^3$, and a single yarn of fiber has a diameter of 8 μm. The wire members 41 have a diameter of 200 μm.

Further, the entire surfaces of the mesh bodies 4 (wire members 41) are covered with Ag which is an electrically conductive material. Therefore, the mesh bodies 4 by themselves have electrical conductivity.

In addition, referring to FIG. 1, lead wires which are outer electrodes 34 are joined to the ends 401 on one side of the mesh bodies 4 buried in the electrically conductive adhesive 33. The outer electrodes 34 are joined in a state wherein the ends 341 on one side of the outer electrodes 34 are in contact with the ends 401 of the mesh bodies 4.

Further, though not shown, the outer circumferential surfaces of the ceramic laminated body 10 are molded with a molding material of silicone resin, which is an insulating resin, so as to cover the entire body.

Further, referring to FIG. 1, in the thus constituted laminated piezoelectric element 1, the inner electrode layers 20 and the outer electrodes 34 are electrically conducting via the electrically conductive adhesive 33 and the mesh bodies 4.

In order to improve electric conduction between the electrically conductive adhesive 33 and the inner electrode layers 20 exposed on the side surfaces 101 and 102 of the ceramic laminated body 10, side electrodes may be formed between the two, i.e., may be formed on the side surfaces 101 and 102. In this case, the side electrodes in the form of thin films having electrical conductivity are so formed as to cover the inner electrode layers 20 that are exposed on the side surfaces 101 and 102. It is also preferable that the side electrodes be made of the same material as the inner electrode layers 20.

Next, described below is a method of producing the laminate-type piezoelectric element 1.

The laminate-type piezoelectric element 1 of this Example is produced by conducting a laminated body-forming step, an adhesive-applying step, a mesh body-arranging step and an external electrode-joining step.

The laminated body-forming step is a step of forming the ceramic laminated body 10 by alternately laminating the piezoelectric layers 11 and the inner electrode layers 20.

The adhesive-applying step is a step of applying the electrically conductive adhesive 33 onto the side surfaces 101 and 102 of the ceramic laminated body 10.

The mesh body-arranging step is a step of burying the mesh bodies 4 obtained by forming a mesh by using a nonmetallic material into the electrically conductive adhesive 33.

The external electrode-joining step is a step of joining the external electrodes 34 onto the electrically conductive adhesive 33.

This method will now be described in detail.

<Laminated Body-Forming Step>

First, a green sheet that serves as the piezoelectric layer 11 is prepared.

A ceramic starting powder which is a piezoelectric material is provided and is pre-calcined at 800 to 950° C. Pure water and a dispersant are added to the pre-calcined powder to obtain a slurry thereof, which is then wet-milled by using a pearl mill. The milled material is dried and degreased, and then has added thereto a solvent, a binder, a plasticizer and a dispersant so as to obtain a slurry thereof, which is then mixed together by using a ball mill. The slurry is defoamed in vacuum and its viscosity is adjusted while it is being stirred by a stirrer in a vacuum device.

Figure 3:
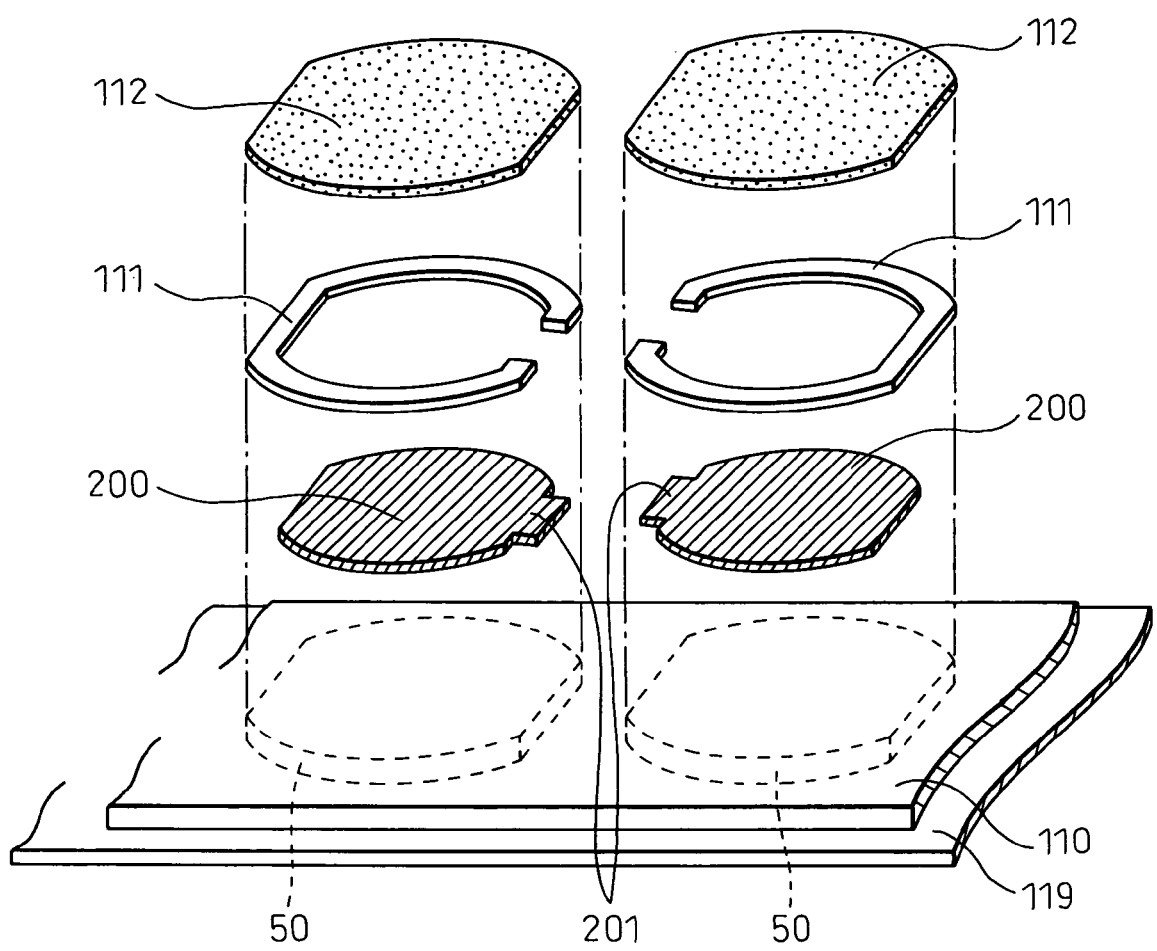
FIG. 3 is a view illustrating a step of printing on a green sheet according to Example 1.

Referring to FIG. 3, the slurry is applied onto a carrier film 119 by a doctor blade method, and a green sheet 110 of a predetermined thickness is formed. FIG. 1 shows only a portion of the elongated green sheet 110.

In this Example, lead zirconate titanate (PZT) is used as a ceramic starting material which becomes a piezoelectric material. The green sheet 110 can be further formed by an extrusion-molding method or by various other methods in addition to the doctor blade method used in this Example.

Next, as shown in FIG. 3, electrode materials 200 that become the inner electrode layers 20 are screen-printed on the punching regions 50 of the formed green sheet 110. Spacer layers 111 having a thickness the same as that of the electrode materials 200 are screen-printed onto the portions where the electrode materials 200 have not been printed so that the height becomes nearly the same between the portions where the electrode materials 200 are printed and other portions. Further, adhesive layers 112 are screen-printed onto the printed electrode materials 200 and the spacer layers 111 in order to enhance the effect of adhesion at the time of laminating the green sheet 110.

The punching regions 50 referred to here are the regions where the green sheet 110 will be punched in a subsequent step. Further, the punching regions 50 in this Example are in the shape of a barrel, but can be changed to various shapes such as a circular shape, a square shape, an octagonal shape or the like shape depending upon the shape of the ceramic laminated body 10 that is fabricated.

Also, in this Example, in order to efficiently punch and laminate the green sheets 110 by using a punching/laminating device that will be described later, the electrode materials 200 exposed on the side surfaces are printed so that the directions of end portions 201 thereof are alternately reversed in the lengthwise direction of the elongated green sheet 110 (see FIG. 3).

A paste of an Ag/Pd alloy is used as the electrode material 200. There can also be used a single metal such as Ag, Pd, Cu, Ni or an alloy such as Cu/Ni, etc.

A paste of the material which is the same as the green sheet 110 is used as the spacer layers 111 and as the adhesive layers 112.

Next, the punching and lamination of the green sheet 110 are executed in parallel by using a punching/laminating device (not shown) that is constituted so as to punch and laminate the green sheet 110 simultaneously. First, the printed green sheet 110 is set together with the carrier film 119 onto the above punching/laminating device, and the punching regions 50 of the green sheet 110 are punched to obtain sheet pieces 51 as shown in FIG. 4.

As the punching/laminating device, there can be used one having punching means with a Thomson blade for punching the green sheet 110 and laminated body-holding means for forming a laminated body by laminating the punched green sheets 110 (sheet pieces 51) and for holding the laminated body.

Figure 5:
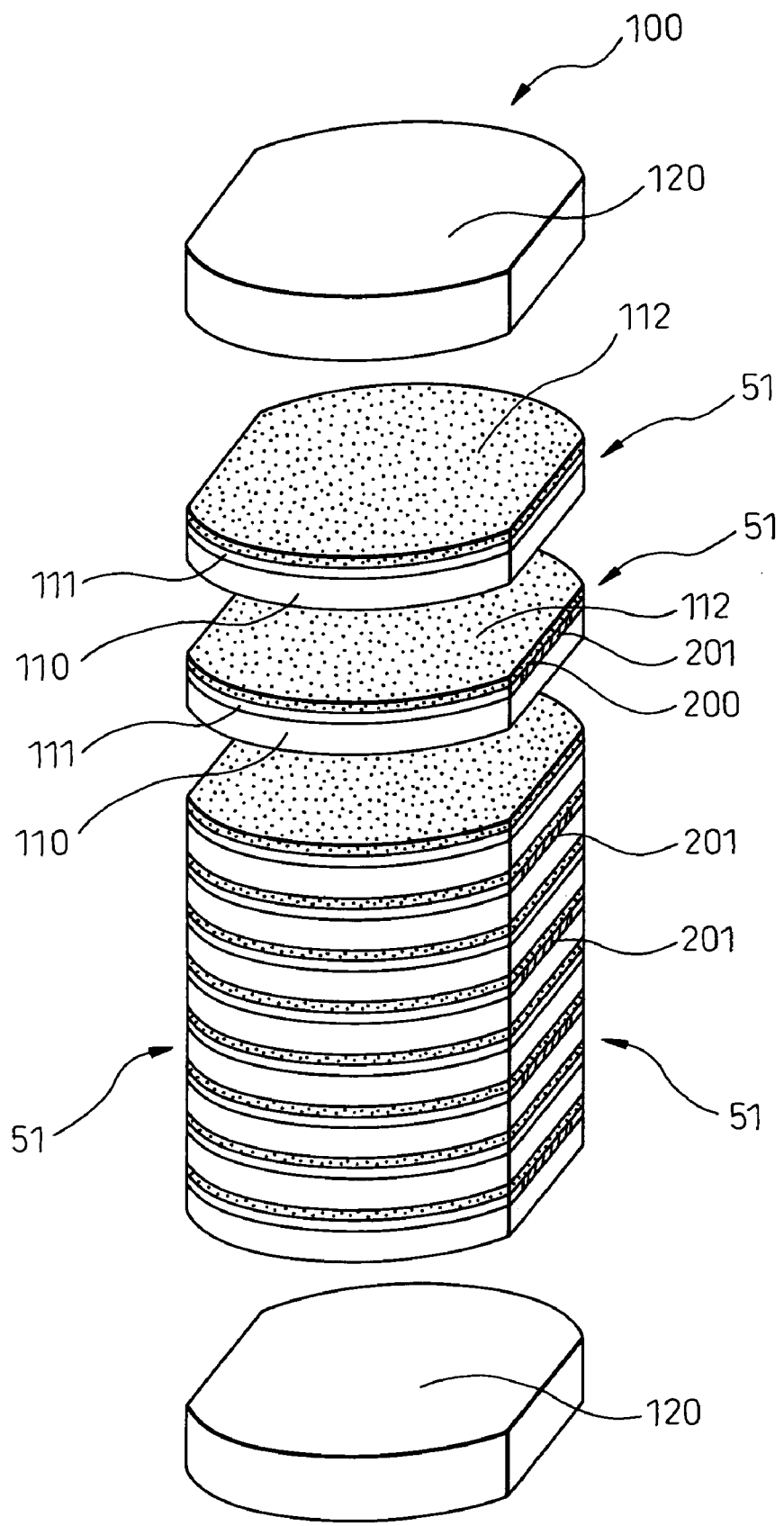
FIG. 5 shows a step of forming an intermediate laminated body according to Example 1.

Referring, next, to FIG. 5, the obtained sheet pieces 51 are laminated so that the end portions 201 of the electrode materials 200 exposed on the side surfaces are placed in alternative directions. Protection layer-forming sheets 120 for forming protection layers 12 in which no piezoelectric displacement takes place are laminated on both ends of the sheet pieces 51 in the direction of lamination. The protection layer-forming sheets 120 are of the same material as the green sheet 110. An intermediate laminated body 100 is thus obtained.

Next, the intermediate laminated body 100 is degreased. The heating condition consists of gradually heating up to 500° C. over 80 hours and holding this temperature for 5 hours. Organic components such as the binder and the like contained in the intermediate laminated body 100 are thus removed. After being degreased, the intermediate laminated body 100 is fired at the highest temperature of 1065° C. for 2 hours. Thus, the ceramic laminated body 10 is obtained as shown in FIG. 2.

As shown in FIG. 2, the ceramic laminated body 10 is obtained by alternately laminating the piezoelectric layers 11 formed by green sheets 110 and the inner electrode layers 20 formed by the electrode materials 200. The adhesive layers 112 serve as part of the piezoelectric layers 11, and the spacer layers 111 serve as non-pole portions 19 in which the ends of the inner electrode layers 20 are retracted inward. Further, protection layers 12 are formed by using the protection layer-forming sheets 120 at both ends of the ceramic laminated body 10 in the direction of lamination.

<Adhesive-Applying Step>

Figure 6:
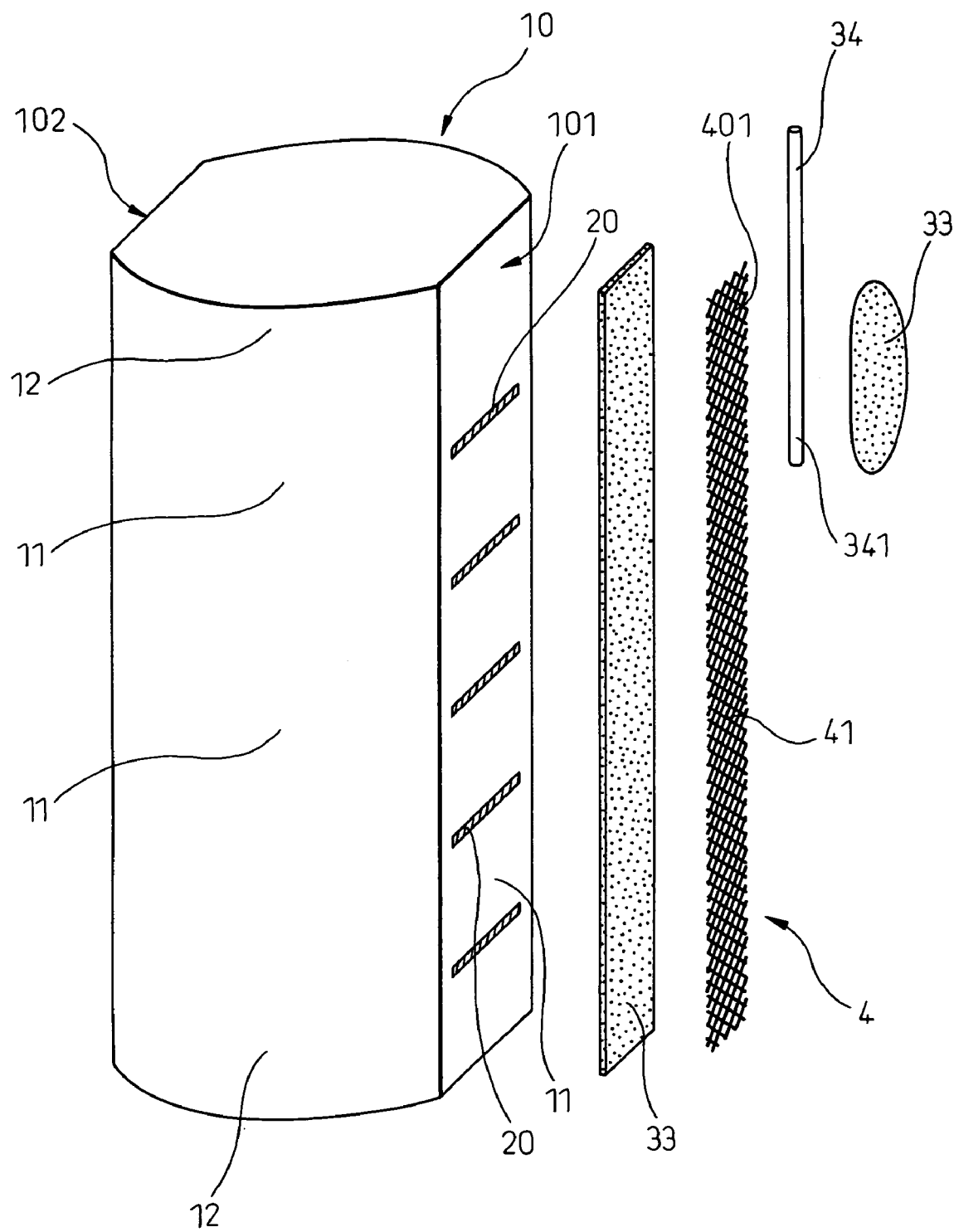
FIG. 6 is a view illustrating a step of application onto the side surfaces of the ceramic laminated body according to Example 1.

Referring next to FIG. 6, the electrically conductive adhesive 33 is applied onto the side surface 101 of the ceramic laminated body 10.

As the electrically conductive adhesive 33 of this Example, there is used one obtained by dispersing a metal filler of Ag as an electrically conductive filler in an epoxy resin which is the resin material.

<Mesh Body-Arranging Step>

Next, the mesh body 4 constituted by knitting wire members 41 of a nonmetallic material like a mesh is buried in the electrically conductive adhesive 33. As described earlier, the wire member 41 comprises a fiber aggregate obtained by bundling fine single yarns of alumina fiber which is a ceramic fiber. The entire mesh bodies 4 are buried in the electrically conductive adhesive 33 (see FIG. 1).

<External Electrode-Joining Step>

Next, the end 341 of the outer electrode 34 is arranged so as to be buried in the electrically conductive adhesive 33. Here, the ends 401 of the mesh bodies 4 buried in the electrically conductive adhesive 33 are in contact with the ends 341 of the outer electrodes 34 (see FIG. 1).

Further, the electrically conductive adhesive 33 is applied to the portions where the ends 341 of the outer electrodes 34 are arranged so as to cover these portions in order to reinforce the junction strength of the outer electrodes 34 (see FIG. 1). Then, the electrically conductive adhesive 33 is heated and cured to join the outer electrodes 34.

FIG. 6 is a diagram schematically illustrating a step of arranging the electrically conductive adhesive 33 and the mesh body 4 on the side surface 101 of the ceramic laminated body 10 to join the outer electrode 34.

Figure 7:
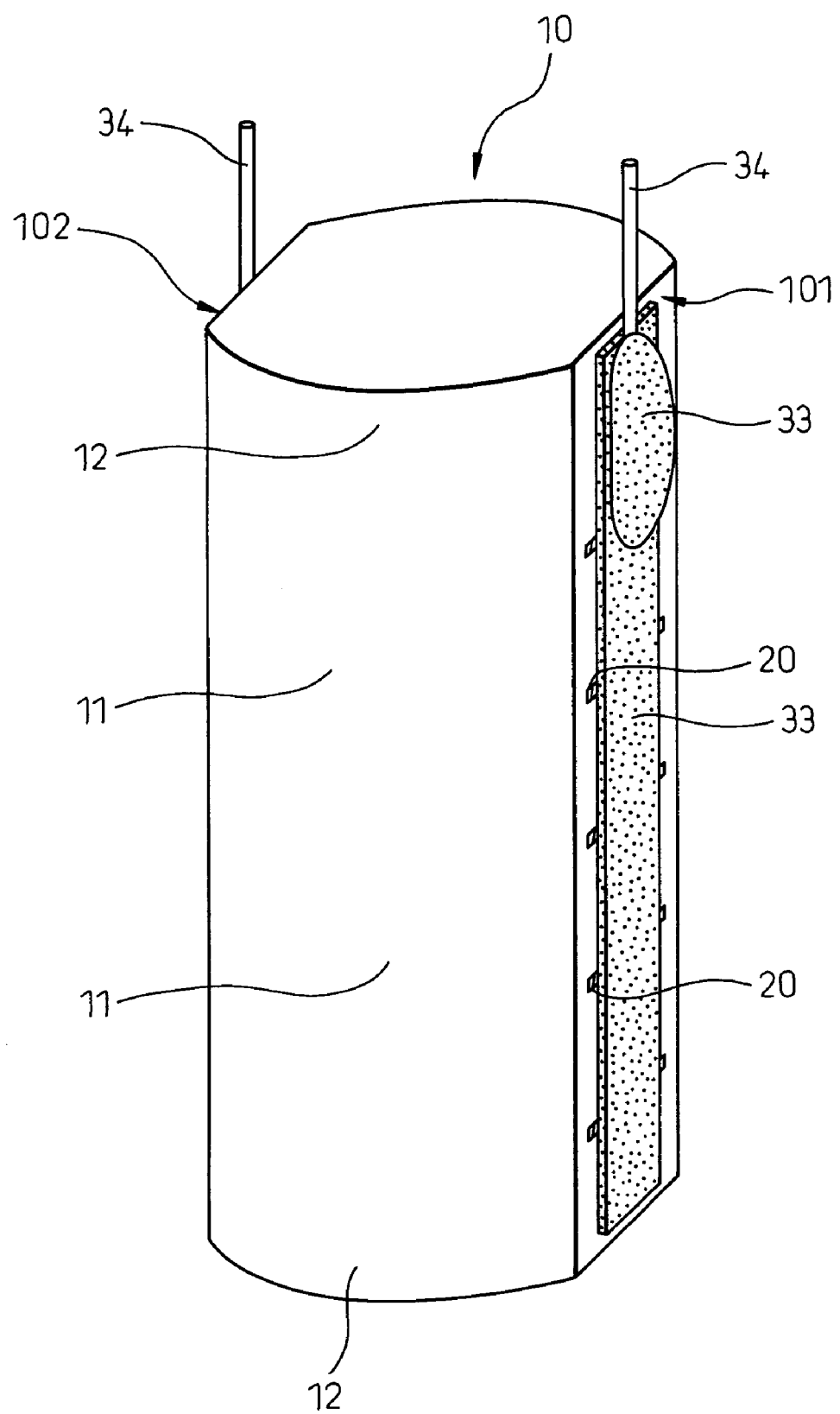
FIG. 7 is a view illustrating a state where an electrically conductive adhesive, a mesh body and an outer electrode are arranged on the side surface of the ceramic laminated body according to Example 1.

Next, the same step as above and executed for the side surface 101 is effected for the side surface 102 of the ceramic laminated body 10. Therefore, as shown in FIG. 7, the electrically conductive adhesives 33 and the mesh bodies 4 are arranged on the side surfaces 101 and 102 of the ceramic laminated body 10 to join the outer electrodes 34.

Finally, though not shown, the entire circumferential side surface of the ceramic laminated body 10 is molded with a molding material. The laminate-type piezoelectric element 1 shown in FIG. 1 is thus completed.

Next, described below are the action and effect of the laminate-type piezoelectric element 1 of this Example.

In the laminate-type piezoelectric element 1 of this Example, the mesh bodies 4 forming a mesh by using a nonmetallic material are buried in the electrically conductive adhesives 33. Therefore, when the element is driven, i.e., when the ceramic laminated body 10 is expanded and contracted in the direction of lamination due to piezoelectric displacement, stress produced in the electrically conductive adhesives 33 provided on the side surfaces 101 and 102 of the ceramic laminated body 10 can be dispersed and relaxed by the mesh bodies 4 of a mesh form buried in the electrically conductive adhesives 33.

The mesh bodies 4 are constituted by using a nonmetallic material. The electrically conductive adhesive 33 in which the mesh bodies 4 are buried is obtained by containing the electrically conductive filler in the resin material that is the chief component. Therefore, while the piezoelectric element is being driven, the mesh bodies 4 made of a nonmetal highly follow the electrically conductive adhesive 33 as compared to when the mesh bodies 4 are constituted by using a metallic material, and work to more effectively relax stress.

Thus, even when the element is repetitively driven, stress can be relaxed to a sufficient degree so as to suppress the occurrence of cracks in the electrically conductive adhesive 33 caused by stress. In addition, conduction can be maintained for extended periods of time between the inner electrode layers 20 and the outer electrodes 34 that are electrically continuous via the electrically conductive adhesive 33, thereby reducing the occurrence of problems such as poor conduction. Therefore, even after being used for extended periods of time, the laminate-type piezoelectric element 1 exhibits excellent durability and reliability.

Also in this Example, the mesh bodies 4 as a whole are buried in the electrically conductive adhesive 33. Therefore, the mesh bodies 4 exhibit the effect of relaxing stress to a sufficient degree and also suppress the occurrence of cracks in the electrically conductive adhesive 33, thus improving the durability and reliability of the laminate-type piezoelectric element 1.

The mesh bodies 4 are constituted by using an alumina fiber which is a nonmetal. Therefore, while the piezoelectric element is being driven, the mesh bodies 4 favorably follow the electrically conductive adhesive 33.

Further, the mesh bodies 4 are constituted by knitting, like a mesh, the wire members 41 of a fiber aggregate obtained by bundling fine yarns of alumina fiber. By using fiber to constitute the mesh bodies 4, it is possible to decrease their weight. Therefore, while the piezoelectric element is being driven, the mesh bodies 4 favorably follow the electrically conductive adhesive 33. In addition, the mesh bodies 4 made of a fiber aggregate exhibit an improved effect in relaxing stress.

The wire members 41 constituting the mesh bodies 4 have a diameter of 200 µm, and the mesh of the mesh members 4 has a pitch P of 400 µm. This ensures sufficient strength of the mesh bodies 4 themselves. Also, while the piezoelectric element is being driven, the mesh bodies 4 favorably follow the electrically conductive adhesive 33.

The surfaces of the mesh bodies 4 are covered with Ag, which is the electrically conductive material. Therefore, the mesh bodies 4 exhibit electrical conductivity. In other words, electric conduction between the inner electrode layers 20 and the external electrodes 34 is maintained via the electrically conductive adhesive 33 and the mesh bodies 4. The electric conduction becomes more reliable upon directly joining the outer electrodes 34 to the mesh bodies 4 as in this Example, and can be sufficiently secured even when the outer electrodes 34 are joined to the electrically conductive adhesive 33.

According to this Example as described above, there are provided a laminate-type piezoelectric element having excellent durability and reliability, and the method of producing the same.

In this Example, alumina was used as a material for constituting the mesh bodies 4. However, it is also possible to use a resin such as polyphenylene sulfide, polyimide, polyester or meta type aramide, ceramics such as silicon carbide or silicon nitride, or a glass such as alkali-free glass. Also, carbon may be used.

An aggregate of fibers obtained by bundling fibers was used as a material for constituting the mesh bodies 4. However, any other shapes may be used.

The mesh of the mesh member 4 may be of a rhombic shape obtained by knitting the wire members 41 aslant as shown in FIG. 8a, or may be of a square shape by knitting the wire members vertically and transversely as shown in FIG. 8b. In addition, various mesh shapes may be employed, such as a circular shape, a triangular shape, a hexagonal shape, etc.

Further, the mesh body 4 may be one obtained by knitting the wire members 41 in a cylindrical shape which is then flattened as shown in FIG. 8c, or may be one obtained by winding the wire members 41 like a round haul net as shown in FIG. 8d.

The mesh body 4 may be one obtained by knitting a plurality of wire members 41 like a mesh as in this Example, or may be one that is integrally formed like a mesh.

Example 2

In this Example, the laminate-type piezoelectric element 1 of Example 1 is used as a piezoelectric actuator for an injector.

Figure 9:
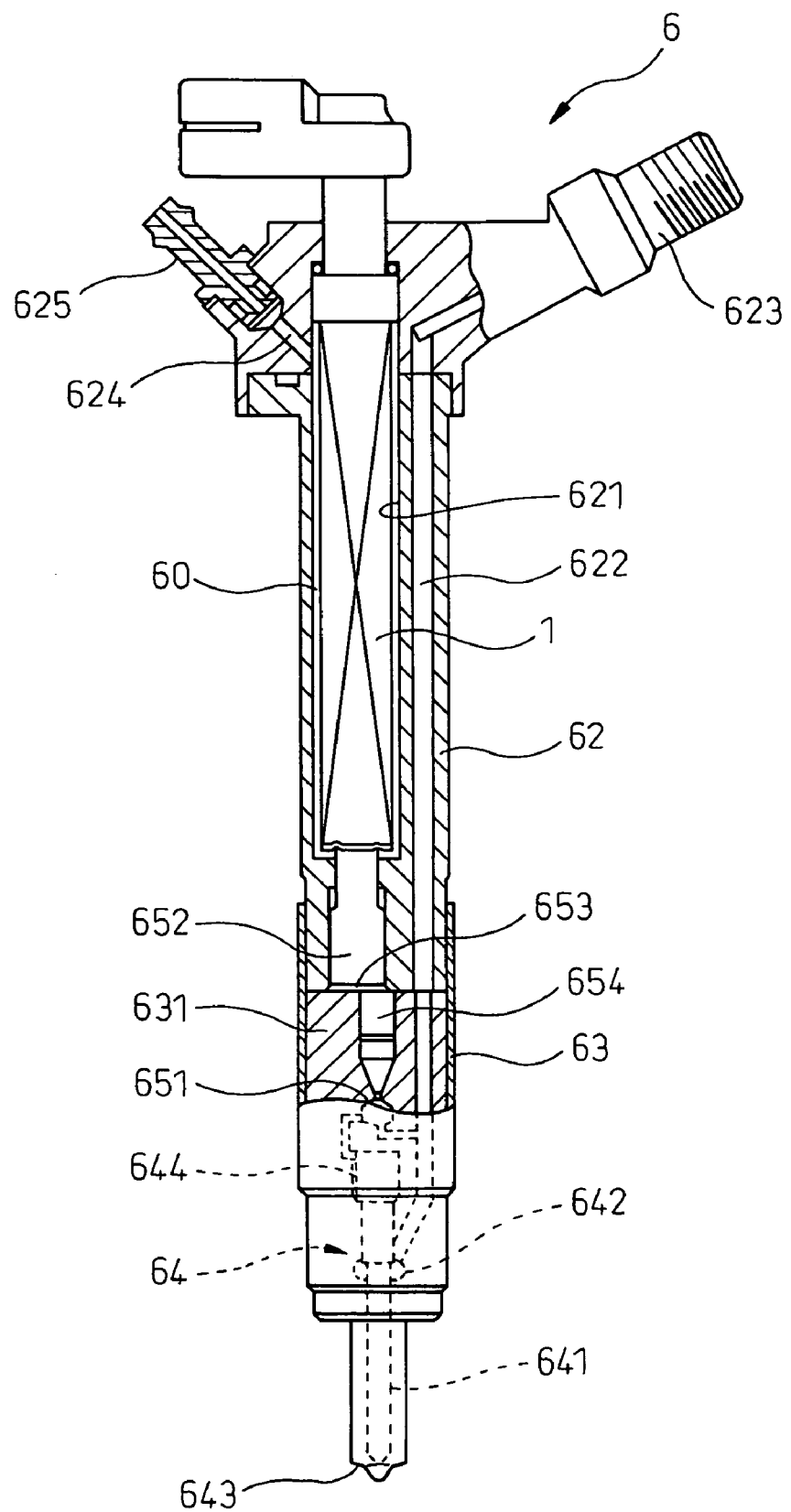
FIG. 9 is a view illustrating the structure of an injector according to Example 2.

The injector 6 of this Example is applied to a common rail injection system of a diesel engine as shown in FIG. 9.

As shown in FIG. 9, the injector 6 has an upper housing 62 accommodating the laminate-type piezoelectric element 1 as a driving part, and a lower housing 63 fixed to the lower end thereof and in which an injection nozzle portion 64 is formed.

The upper housing 62 is of nearly cylindrical shape, and has the laminate-type piezoelectric element 1 inserted and fixed in a longitudinal hole 621 which deviates from the center axis By the side of the longitudinal hole 621, a high-pressure fuel passage 622 is provided in parallel, and an upper end thereof communicates with a common rail (not shown) through a fuel introduction pipe 623 that protrudes at an upper side portion of the upper housing 62.

A fuel outflow pipe 625 protrude from an upper side portion of the upper housing 62 so as to communicate with a drain passage 624, and the fuel flowing out from the fuel outflow pipe 625 is returned back to a fuel tank (not shown).

The drain passage 624 passes through a gap 60 between the longitudinal hole 621 and the driving part (laminate-type piezoelectric element) 1, and communicates with a three-way valve 651 through a passage (not shown) extending downward from the gap 60 through the upper and lower housings 62 and 63.

The injection nozzle portion 64 is provided with a nozzle needle 641 that slides up and down in a piston body 631, and an injection port 643 that is opened and closed by the nozzle needle 641 and injects the high-pressure fuel supplied from a fuel reservoir 642 to each cylinder of the engine. The fuel reservoir 642 is provided around the nozzle needle 641 at an intermediate portion thereof and where the lower end of the high-pressure fuel passage 622 opens. The nozzle needle 641 receives the pressure of fuel from the fuel reservoir 642 in a direction in which the valve opens and also receives the pressure of fuel in a direction in which the valve closes from a back pressure chamber 644 which is provided facing the upper end thereof. When the pressure in the back pressure chamber 644 decreases, the nozzle needle 641 is lifted up, whereby the injection port 643 opens and the fuel is injected.

The pressure in the back pressure chamber 644 is increased or decreased by the three-way valve 651. The three-way valve 651 is constituted so as to selectively communicate the back pressure chamber 644 with the high-pressure fuel passage 622 or with the drain passage 624. A ball-like valve body that opens/closes the port is used to communicate with the high-pressure fuel passage 622 or with the drain passage 624. The valve body is driven by the driving part 1 via a piston 652 of a large diameter, a hydraulic chamber 653 and a piston 654 of a small diameter which are arranged thereunder.

In this Example, the laminate-type piezoelectric element 1 of Example 1 is used as the driving source in the injector 6 constituted as described above. The laminate-type piezoelectric element 1 has excellent durability and reliability as described above. Therefore, performance of the injector 6 as a whole can be enhanced.

What is claimed is:

1. A laminate-type piezoelectric element comprising:
   a ceramic laminated body having alternately laminated piezoelectric layers made of a piezoelectric material and inner electrode layers having electrical conductivity, and having outer electrodes joined to the side surfaces of said ceramic laminated body via an electrically conductive adhesive,
   wherein said electrically conductive adhesive has buried therein at least parts of a mesh body formed as a mesh including nonmetallic material.

2. A laminate-type piezoelectric element according to claim 1, wherein:
   said nonmetallic material in the mesh body comprise at least one of a resin, ceramic, carbon or glass.

3. A laminate-type piezoelectric element according to claim 1, wherein:
   said nonmetallic material in the mesh body comprise a knitted fiber of a nonmetallic material.

4. A laminate-type piezoelectric element according to claim 3, wherein:
   the fiber is a fiber aggregate obtained by bundling smaller fibers.

5. A laminate-type piezoelectric element according to claim 1, wherein:
   the surfaces of said mesh body are covered with an electrically conductive material.

6. A laminate-type piezoelectric element according to claim 5, wherein:
   said electrically conductive material contains at least one of Pt, Pd, Ta, Au, Ag, Cu, Ni, Zn and Sn.

7. A laminate-type piezoelectric element according to claim 1, wherein:
   said laminate-type piezoelectric element is a piezoelectric actuator for an injector used as a drive source of the injector.

8. A method of producing a laminate-type piezoelectric element having a ceramic laminated body obtained by alternately laminating piezoelectric layers made of a piezoelectric material and inner electrode layers having electrical conductivity, and having outer electrodes joined to the side surfaces of said ceramic laminated body via an electrically conductive adhesive, the method comprising:
   forming a ceramic laminated body by alternately laminating piezoelectric layers and inner electrode layers;
   applying electrically conductive adhesive to side surfaces of said ceramic laminated body;
   burying at least parts of a mesh body formed by using a nonmetallic material in said electrically conductive adhesive; and
   joining said external electrodes to said electrically conductive adhesive.

9. A method of producing a laminate-type piezoelectric element according to claim 8, wherein:
   said mesh body is made by using at least one of a resin, ceramic, carbon or glass.

10. A method of producing a laminate-type piezoelectric element according to claim 8, wherein:
    said mesh body is made by knitting a fiber made of a nonmetallic material.

11. A method of producing a laminate-type piezoelectric element according to claim 10, wherein:
    the fiber is a fiber aggregate obtained by bundling smaller fibers.

12. A method of producing a laminate-type piezoelectric element according to claim 8, wherein:
    surfaces of said mesh body are covered with an electrically conductive material.

13. A method of producing a laminate-type piezoelectric element according to claim 12, wherein:
    said electrically conductive material contains at least one of Pt, Pd, Ta, Au, Ag, Cu, Ni, Zn and Sn.

* * * * *